United States Patent [19]

Wichelman

[11] Patent Number: 4,994,808
[45] Date of Patent: Feb. 19, 1991

[54] PIPELINED ANALOG TO DIGITAL CONVERTER WITH SUMMING AND COMPARATOR FUNCTIONS OCCURRING IN PARALLEL FOR EACH BIT

[76] Inventor: Karl F. Wichelman, P.O. Box 2000, Chico, Calif. 95927

[21] Appl. No.: 450,662

[22] Filed: Dec. 14, 1989

[51] Int. Cl.[5] .............................................. H03M 1/38
[52] U.S. Cl. .................................... 341/161; 341/155; 341/162
[58] Field of Search ............... 341/155, 156, 158, 161, 341/162, 165, 172, 159

[56] References Cited

U.S. PATENT DOCUMENTS

| | | | |
|---|---|---|---|
| 3,573,798 | 4/1971 | Reiling | 341/159 |
| 3,577,139 | 5/1971 | Foerster | 341/162 |
| 4,072,938 | 2/1978 | Buchanan | 340/347 AD |
| 4,275,386 | 6/1981 | Michel et al. | 341/159 |
| 4,334,745 | 6/1982 | Maida | 341/159 |
| 4,611,196 | 9/1986 | Fernandez | 341/158 |
| 4,684,924 | 8/1987 | Wood | 340/347 AD |
| 4,760,376 | 7/1988 | Kobayashi et al. | 341/155 |
| 4,769,628 | 9/1988 | Hellerman | 341/162 |

Primary Examiner—William M. Shoop, Jr.
Assistant Examiner—Randy W. Gibson

[57] ABSTRACT

A method and an apparatus are disclosed for analog-to-digital conversion where a reference signal is subtracted from the analog input signal, if needed. The mathematical functions are processed simultaneously with each bit's reference compare decision. The comparator's output control a switch which allows the analog input signal to bypass the summing circuit for certain digital outputs of the comparator. This reduces voltage error and conversion time by keeping the summing circuits out of the signal path if the corresponding bit is not actively represented in the binary word. This allows the converter to avoid synchronization requirements that many other types of A/D converters have.

13 Claims, 8 Drawing Sheets

PIPELINED ANALOG TO DIGITAL CONVERTER WITH SUMMING AND COMPARATOR FUNCTIONS OCCURRING IN PARALLEL FOR EACH BIT

BACKGROUND OF THE INVENTION

1. Field of the invention:

An Analog-to-Digital converter (A/D). This invention relates to the sampling of analog wave forms and the measuring of their amplitude at periodic intervals, and generating a binary word to represent the analog amplitude. The binary word may be stored, signal processed by a computer, or transmitted.

2. Description of the prior art:

Heretofore many methods to convert an analog input signal to a digital binary word of n-bits have been used. The problem is, as the number of bits increases, the conversion time increases, reducing the highest frequency that may be sampled. As the number of bits increases, the cost of an analog-to-digital converter increases.

The three most commonly used methods to date are:

(1) SUCCESSIVE APPROXIMATION REGISTER (SAR), a technique where the unknown analog input voltage is compared, one at a time, to the voltages between a series of resistors using analog switches controlled with each clock cycle, by an algorithm. This method requires an 8-bit digital output to have 256 resistors and a maximum of 128 clock cycles to complete one A/D conversion.

The problem with this technique is the number of clock cycles and electronic components increase exponentially with each binary bit added to the binary word. By contrast, the present invention requires at most only one clock cycle to produce a binary word of any number of bits.

(2) BINARY COUNTER is a technique where a binary counter increments with each clock cycle. The binary counter is coupled to a digital-to-analog converter generating a reference voltage. When the reference voltage is equal to the analog input voltage, a comparator changes it's output logic level and stops the incrementing process. The binary word at that point is the output.

The problem with this technique is the number of clock cycles required increases exponentially with each binary bit added to the binary word. With each added bit the time required to make an A/D conversion increases exponentially, reducing the highest frequency that can be converted to a digital binary word. By contrast, the present invention requires at most only one clock cycle to produce a binary word of any number of bits.

(3) FLASH CONVERTERS are a clockless method of converting analog signals to digital binary words using a resistive divider with the number of resistors equal to 2" (n=number of output bits). A separator voltage comparator is coupled to each node of the resistive divider, and the other input of the comparator is coupled to the analog input signal. Logic levels from the comparators' outputs connect to a decimal to BCD (Binary Coded Decimal) decoder where the binary output is taken.

The problem with this technique is that the electronic component count increases exponentially with each binary bit added to the binary word output. This technique requires no clock and is very fast, but the exponential increase in the number of electronic components physically limits the number of binary output bits that can be generated on an integrated circuit. 4,684,924 Class 340/347 AD, by Wood Date: Aug. 4, 1987 TITLE: Analog/Digital Convert Using Remainder Signals Wood discloses a series summing A/D converter that differs from the present invention in that the analog input signal must travel through every summing circuit regardless of the size of the word or number of binary bits used. This is inherently slower and produces a voltage error with each summing circuit in the analog input signal path. By contrast, the present invention bypasses the summing circuit if the associated bit is not represented in the binary word. This makes the present invention very accurate when converting to digital binary words very small analog voltages that require only the very least significant bits. 4,072,938 Class 340/347 AD, by Buchanan Date: Feb. 7, 1978 TITLE: Bucket Brigade Analog-to-Digital Converter Buchanan discloses an A/D converter using a charged capacitor, charged by the analog input signal voltage and a reference voltage. The capacitor's charge is the difference of the two potentials. This potential difference is serial shifted to the next less significant bit stage by a clock, where a comparison to the next less significant bit reference voltage is made and then clocked again to the next less significant bit stage and so on. This clocked serial shift method means, to make a 12-bit binary word requires at least 12 clock cycles, instead of only one clock cycle as with the present invention.

SUMMARY OF THE INVENTION

It is the objective of the first embodiment of the present invention to show an analog-to-digital converter using a parallel summing method where a subtraction is made on a bit-to-bit basis to the analog input signal voltage, if needed. The mathematical functions are processed simultaneously with each bits' reference voltage compare decision, with the mathematical functions being bypassed if not needed. This reduces voltage error and conversion time by keeping the summing circuits out of this signal path if the bit is not actively represented in the binary word. This method also eliminates switch synchronization requirements that many other types of A/D converters have.

It is the objective of the second embodiment of the present invention to show an analog-to-digital converter using a parallel reference voltage summing method where an addition is made to the reference voltage(s) of the remaining less significant bits on a bit-to-bit basis, if needed.

It is a further objective of this invention to show several methods of constructing a summing circuit by means of a charged capacitor.

It is a further objective of this invention to show several methods of charging said summing capacitor.

It is a further objective of this invention to show a method of constructing a summing circuit by means of a semiconductor diode element.

DESCRIPTION OF THE PREFERRED EMBODIMENT

Figure 1:
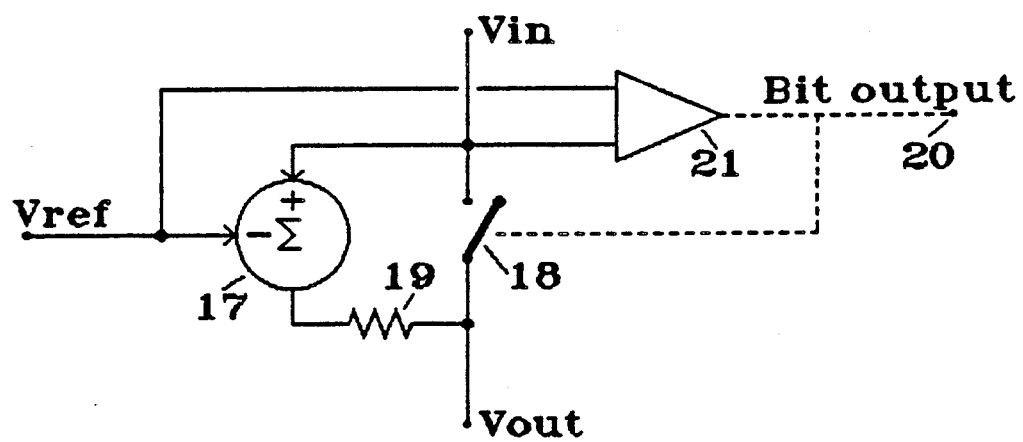
FIG. 1 shows the circuitry, in block form, needed for each binary bit output, using the parallel summing method.

The present inventions' theory and function is now described in detail. FIG. 1 shows a first single cell or stage of the parallel summing analog-to-digital converter. Each cell generates one binary output bit and when connected in series, one cell to another by connecting the terminal point Vout to Vin of the next less significant bit, forms an A/D converter using a method of subtracting predetermined potentials equal to the value of the bits actively represented in the binary word from the analog input signal.

Each bit is processed by a circuit comprised of a comparator 21, a reference voltage Vref, an analog input signal Vin, a summing circuit 17, an analog switch 18, a binary output bit 20, an analog output signal remainder voltage Vout, and an output separating resistance 19 between the output of the summing circuit 17 and the output of the analog switch 18.

Comparator 21 has two inputs, one responsive to the analog input signal Vin and the other responsive to a reference voltage Vref. Comparator 21 also has one output, the binary bit output 20, to indicate if the analog input signal voltage is greater then, or equal to, the reference voltage. The output 20 of the comparator 21 also controls the analog switch 18. The summing circuit 17 subtracts Vref from Vin and the output, the remainder or difference of the two potentials, is passed on to the next less significant bit attached to the Vout terminal if switch 18 is opened by comparator 21. If the analog switch 18 is closed, the remainder or difference potential from the summing circuit 17 does not affect Vout. That is, resistor 19 separates the summing circuit 17 output from the output of the analog switch 18 when Vin is coupled directly to Vout. Assuming the inputs of the comparator 21 and summing circuit 17 of the next less significant bit have high impedances, no current flows through resistor 19 when the analog switch is open. Furthermore, when the analog switch 18 is opened the resistance between the two terminal points, Vin and Vout, becomes very large. When the analog switch 18 is closed, the resistance between the two terminal points Vin and Vout becomes very small.

Referring again to FIG. 1: an unknown input voltage, Vin is compared to a reference voltage Vref by comparator 21.

If Vin < Vref the output of the comparator 21 does not change logic levels. The analog switch 18 is not opened. The summing circuit 17 is bypassed.
Vin = Vout.
Output 20 does not change.

If Vin > = Vref the output of the comparator 21 does change logic levels. The analog switch 18 is opened by output 20 of the comparator 21. The summing circuit 17 is not bypassed. The reference voltage Vref is subtracted from Vin and the voltage difference, the remainder voltage, is the output Vout to the next less significant bit stage.
Vin − Vref = Vout.
Output 20 does change from previous condition.

The change in logic levels from comparator's 21 output 20 indicates the input voltage Vin > = Vref. Output 20 of comparator 21 is the binary bit output. A change in logic levels is a binary change from a logic one to a logic zero or vice versa.

The single cell shown in FIG. 1 connects in series n times to produce a binary word of n-bits, where n is any integer number.

Figure 2:
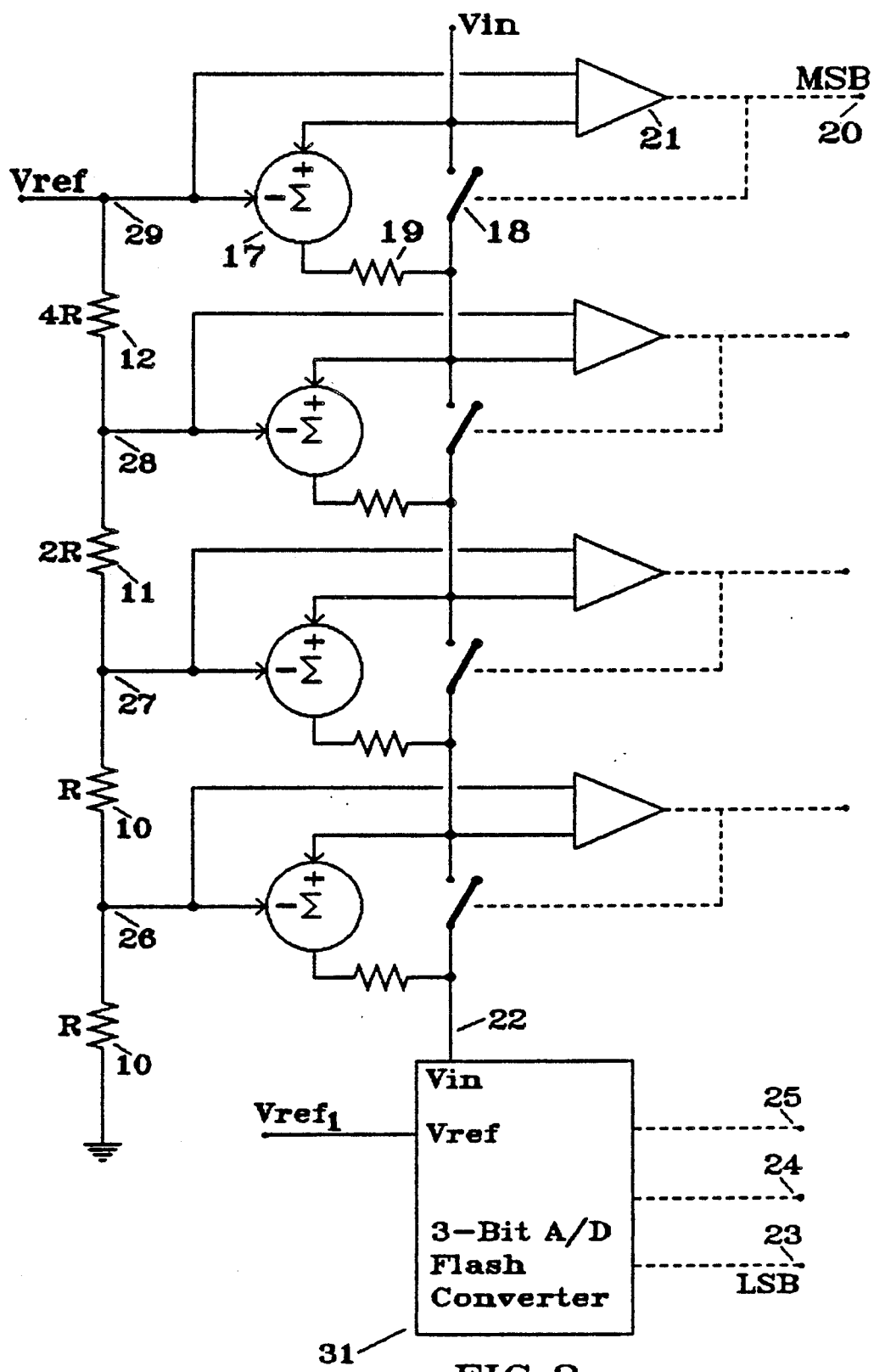
FIG. 2 shows two types of analog-to-digital converters combined to make a 7-bit binary word. 4-single-bit parallel summing circuits from FIG. 1 are connected in series to form a 4-bit word. A 3-bit flash converter is connected to the remainder analog output voltage from the parallel summing A/D converters to form the three least significant bits.
Figure 5:
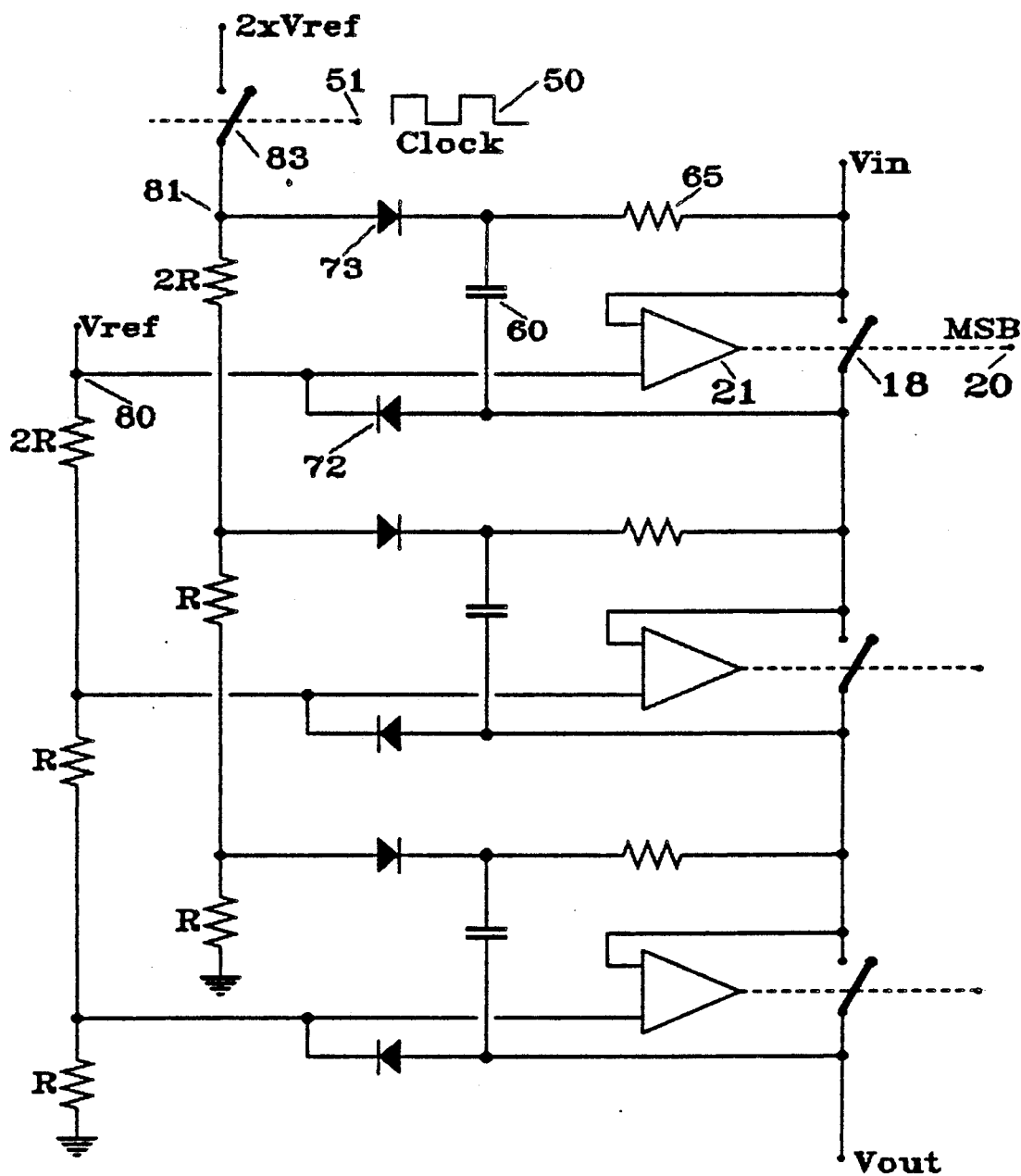
FIG. 5 shows a 3-bit A/D converter using two reference voltage ladders. Summing circuits of the form shown in FIG. 4, using a charged capacitor and a discharge resistor, connected in series to form a 3-bit binary word. This configuration uses two precision diodes per bit to charge the summing capacitor instead of the analog switches as in FIGS. 3 and 4.
Figure 7:
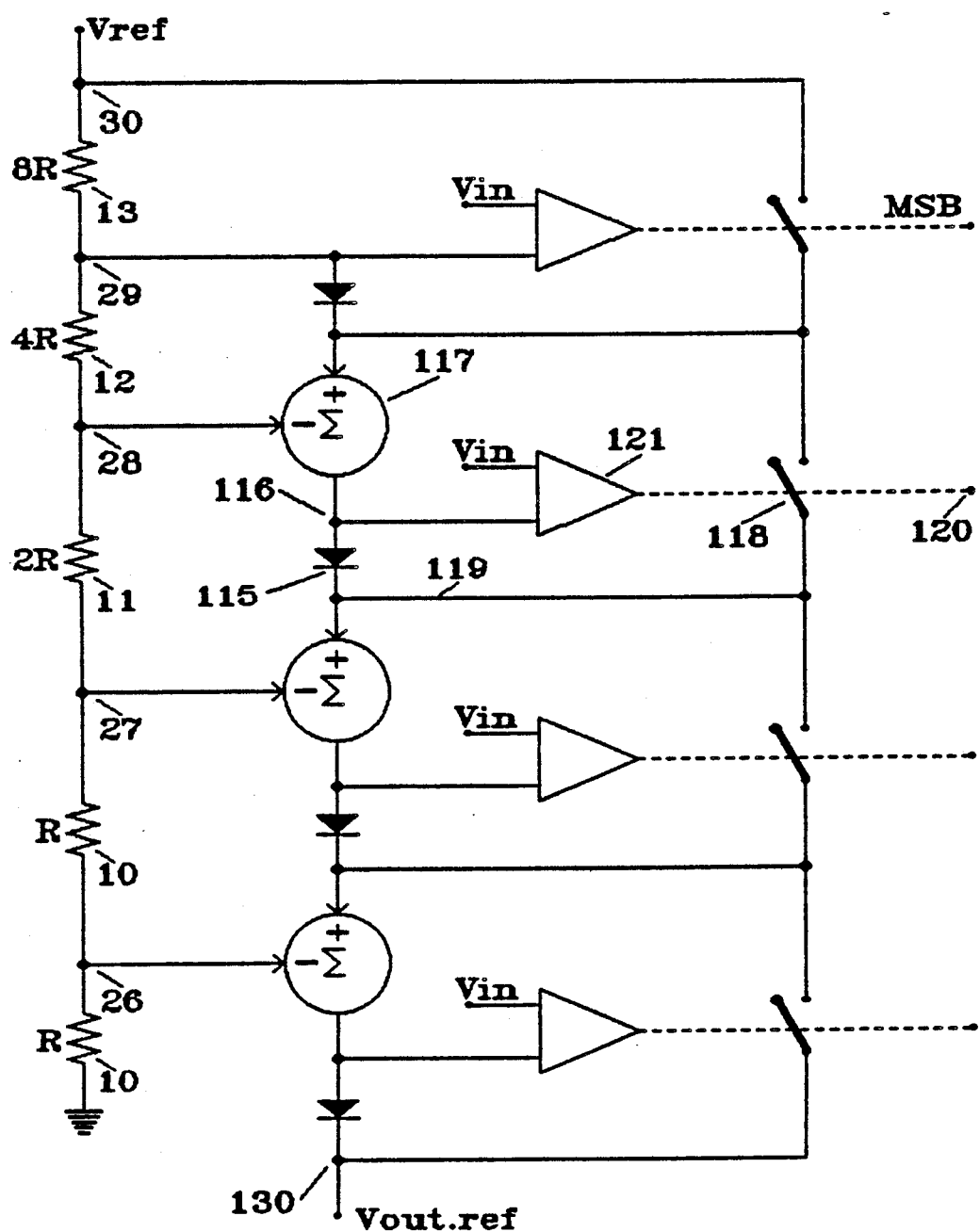
FIG. 7 shows a 4-single-bit parallel reference voltage summing circuits from FIG. 6 connected in series to form a 4-bit binary word.
Figure 8:
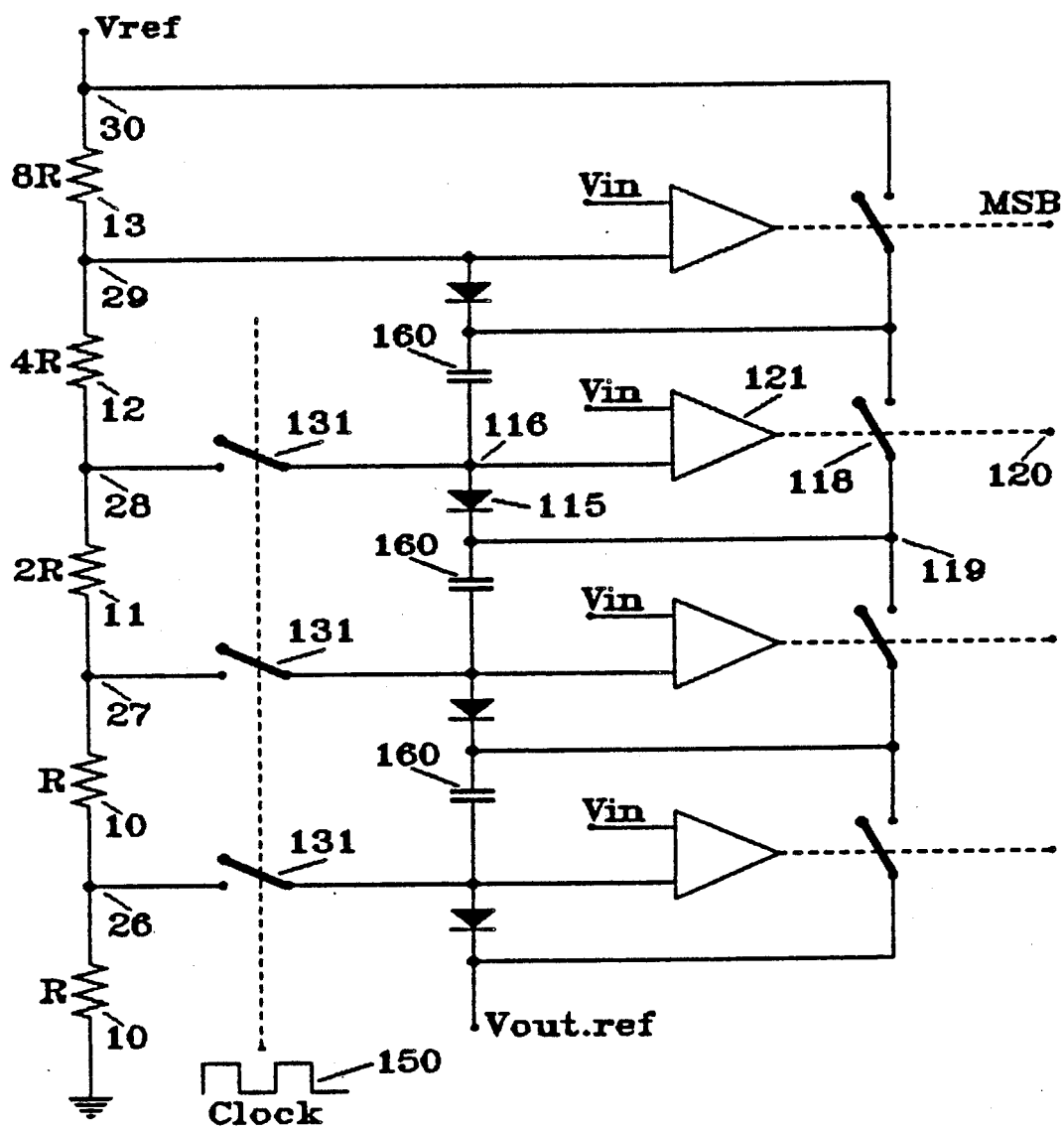
FIG. 8 shows a 4-bit parallel reference voltage summing A/D converter using charged capacitors to perform the summing functions, switches connected to reference voltages to charge the capacitors during the charging half of the clock cycle.

Referring now to FIGS. 2, 7 and 8, resistors 10, 11, 12 and (in FIGS. 7 and 8) resistor 13 indicate the generation of binary reference voltage ladders. Resistor 11 is twice the value of resistor 10. Resistor 12 is twice the value of resistor 11. Resistor 13 is twice the value of resistor 12. The voltages at 26, 27, 28, 29 and 30 are such that V(30) = 2*V(29), V(29) = 2*V(28), V(28) = 2*V(27), V(27) = 2*V(26). In FIG. 5 resistors 10 and 11 are shown as resistor ladders 80 and 81.

Note: V(xx) indicates the voltage at that point. Buffer amplifiers may be required anywhere in the circuit and are usually required between the reference voltage ladders and the circuit the reference voltage connects to. Any means to generate a reference voltage will work. The reference voltage can be set to a logarithmic scale for logarithmic conversion. Power supply connections are not shown for the OPamps, switches or summing circuits. All digital signal connections are shown as dotted lines. MSB = Most Significant Bit. LSB = Least Significant Bit. Sample and hold circuits are routinely used between the Vin terminal and the analog input signal source which are not shown or described. An absolute value circuit to generate a sign-bit and to always keep the input positive are commonly used between the Vin terminal and the analog input signal source which are not shown or described. Many methods of error correcting exist, some of which will be compatible with this circuit, that are not shown or described.

FIG. 2 shows 4-single-bit cells from FIG. 1 connected in series, plus a 3-bit flash analog-to-digital converter 31 connected to the remainder output 22 to make a 7-bit analog-to-digital converter. Vref1 is the reference voltage for the 3-bit flash A/D converter. 23, 24, 25 are the binary outputs from the flash A/D converter where 23 is the LSB for the flash A/D converter and the overall binary word of the two combined A/D converters. 25 is the MSB for the flash A/D converter, but only the third MSB for the total 7-bit binary word. The parallel summing A/D converter makes the upper four MSBs of the overall binary word.

Figure 3:
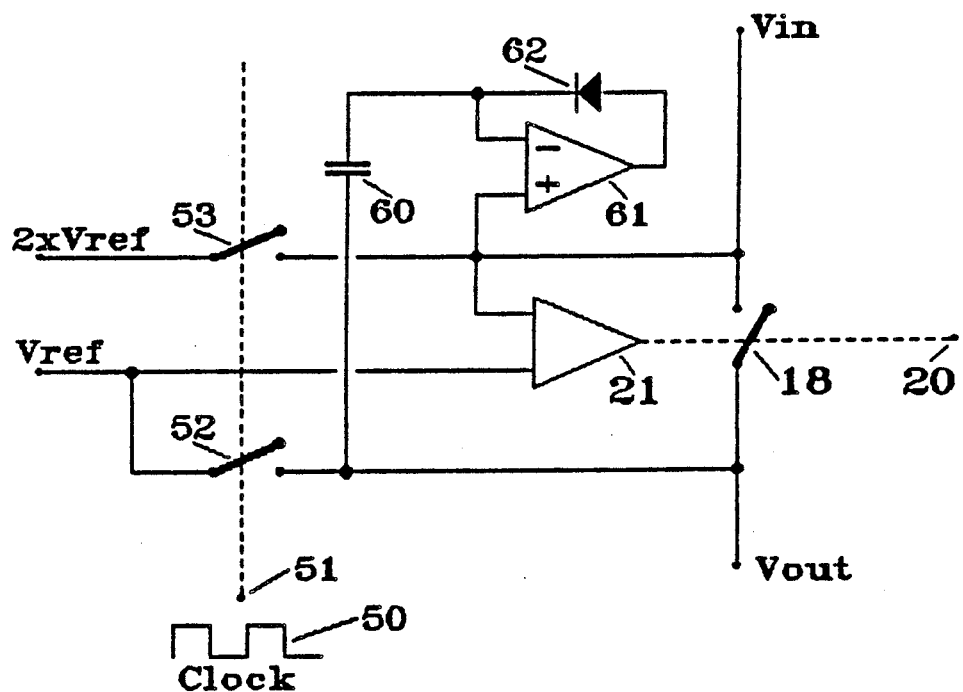
FIG. 3 shows a detailed method of achieving the summing function using a charged capacitor and a precision diode.

FIG. 3 shows a single bit of n-bits of the parallel summing A/D converter using a charged capacitor 60 as a method of subtracting Vref from Vin. Capacitor 60 functions as the summing circuit 17. This method uses a clock 50 running at the sampling frequency. The clock 50 opens and closes switches 52 and 53 simultaneously by control line 51. During the first half of the clock cycle the capacitor 60 is charged. During the second half of the clock cycle the A/D conversion is done.

The charging half of the cycle is now described. During this part of the clock cycle, switches 52 and 53 are closed, coupling the capacitor 60 to the reference voltages. Switch 53 is coupled to twice the reference voltage for that bit (2*Vref), causing comparator 21 to open switch 18. OPamp 61, charges capacitor 60 through diode 62 up to the voltage between 2*Vref and Vref, 2*Vref−Vref=Vref. Vref is the voltage the comparator 21 is comparing Vin to, and the voltage that will be subtracted from Vin if Vin>=Vref. During the charging half of the clock cycle, the Vin terminal is disconnected from any input source.

The A/D conversion half of the clock cycle is now described. During this part of the clock cycle, switches 52 and 53 are opened and the Vin terminal is reconnected to the analog input source.

If Vin>=Vref, switch 18 stays open. The capacitor 60 with it's voltage opposed to Vin is in series between Vin and Vout, implementing the mathematical subtraction Vin−Vc=Vout, where Vc=Vref (Vc=the potential in volts across the capacitor 60 induced by the charge on the capacitor 60).

If Vin<Vref then switch 18 is closed and Vin=Vout. The precision diode shown as OPamp 61 and diode 62 keeps the capacitor 60 from discharging when switch 18 is closed.

Precision diodes are well known to anyone skilled in the art and should not need any further explanation. Zero forward voltage drop is assumed.

Figure 4:
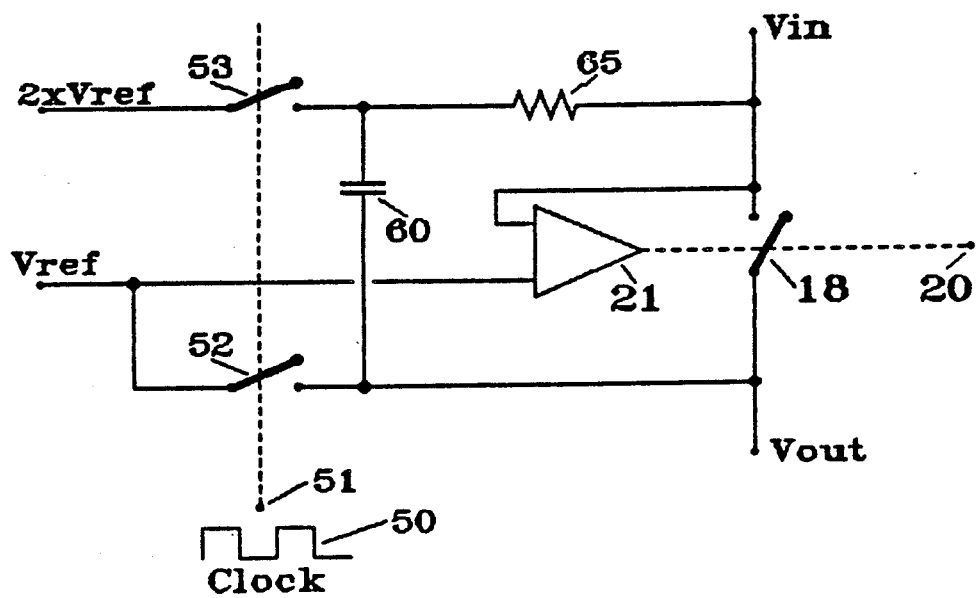
FIG. 4 shows a detailed method of achieving the summing function using a charged capacitor and a discharge resistor.

FIG. 4 works in the same manner as FIG. 3, except for the replacement of the precision diode, numbered 61 and 62, with a passive resistance 65.

During the A/D conversion half of the clock cycle, switches 52 and 53 are opened.

If Vin>=Vref, switch 18 stays open. The voltage across the capacitor 60 is subtracted from Vin, Vin−Vc=Vout where Vc=Vref.

Because the OPamp's inputs have high impedance, there is no current flow through the resistor 65 when switch 18 is opened.

If Vin<Vref, then switch 18 is closed, the capacitor 60 discharges through resistor 65, and Vin equals Vout. Capacitor 60 is recharged with the next half of the clock cycle.

In FIG. 5, switches 52 and 53 are replaced by precision diodes 72 and 73. Diode 72 is connected to the constant reference voltage ladder 80. The voltage ladder 80 also supplies the constant reference voltages to the comparators 21.

The reference voltage ladder 81 potentials oscillates between zero and 2*Vref, controlled by clock 50 operating switch 83 at the sampling rate. The sampling rate is the number of complete analog-to-digital conversions per second. The reference voltage ladder 81 connects to diode 73.

Theory of operation: During the charging half of the clock cycle, switch 83 closes and the Vin terminal is disconnected from any input signal source. During this half of the clock cycle, diodes 73 and 72 become forward biased, charging capacitors 60 to the potential between the two reference voltage for that bit. This is always a ratio equal to 2*Vref−Vref, which is equal to Vref for that particular bit. During the A/D conversion half of the clock cycle, switch 83 is opened, Vin is reconnected to the analog input signal source and diode 73 becomes reverse biased.

If Vin>=Vref, switch 18 stays open. After subtraction of Vc from Vin, the higher constant reference voltage of ladder 80 reverse biases diode 72 and does not interfere with the Vin signal. FIG. 5 shows a 3-bit A/D converter, but an A/D converter may be constructed n-bits long.

Figure 6:
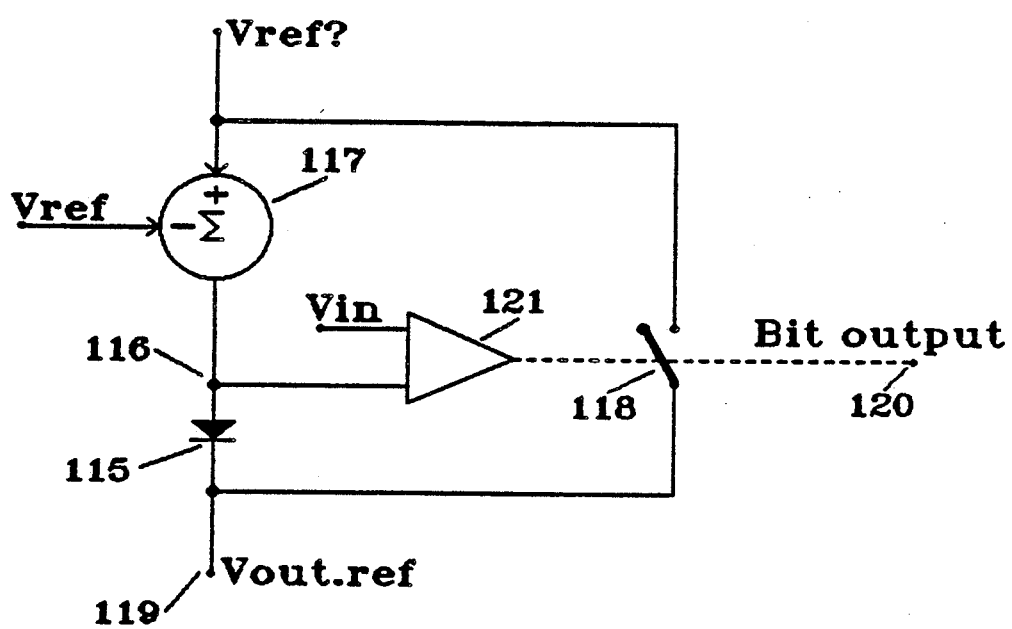
FIG. 6 shows, in block form, a parallel reference voltage summing A/D converter where the condition of the comparator (a binary one or zero) determines the value of the remaining less significant bits' reference voltage.

FIG. 6 shows a first single cell, or stage, of the parallel reference voltage summing analog-to-digital converter, the second embodiment of my invention. This A/D converter changes an analog voltage into a digital binary word by means of changing the reference voltage to the remaining less significant bits. Diode 115 represent a precision diode as shown in FIG. 3 using the OPamp 61 and a diode 62.

An A/D converter uses a method of adding a predetermined potential equal to the value of the bit it represents in the binary word to the reference voltage(s) of the remaining less significant bits.

Each bit's circuitry comprises: a comparator 121, a set reference voltage Vref, a previous bit's generated reference voltage Vref? (the reference voltage for the MSB is described later), an analog input signal voltage Vin, a summing circuit 117, a binary output bit 120, a generated reference voltage output 119 Vout.ref, an analog switch 118, a precision diode functioning circuit diode 115.

The summing circuit 117 subtracts the previously bit's generated reference voltage Vref? from a set reference voltage Vref and the difference of the two potentials becomes the reference voltage V(116) for this bit. The reference voltage V(116) is coupled to the comparator 121.

Comparator 121 has two inputs, one responsive to the analog input signal Vin and the other responsive to a generated reference voltage V(116). The comparator 121 output 120 is the binary bit output to indicate if the analog input signal voltage Vin is greater then or equal to, the generated reference voltage V(116). Output 120 also controls the analog switch 118. The diode 115 protects the generated reference voltage V(116) coupled to the comparator 121 from the effects of the analog switch 118. If the analog switch 118 is closed, the potential at V(119) will be greater then the voltage at V(116), diode 115 becomes reverse biased with no current flow. If the analog switch 118 is opened, the potential at V(119) is equal to the voltage at V(116) because of diode 115 being forward biased. The inputs of the comparator 121 and the summing circuit 117 assume high impedance. When the analog switch 118 is opened, the resistance between the two terminal points Vref? and V(119) becomes very large. When the analog switch 18 is closed, the resistance between the two terminal points Vref? and V(119) becomes very small.

The previous bit's generated reference voltage Vref? is either, a set reference voltage for the MSB which is 2*Vref or, for the less significant bits a voltage that is not known for certain, but always greater then or equal to 2*Vref.

The generation of voltage 119 (Vout.ref), the reference voltage for the remaining less significant bit(s), is generated from the following components. Two reference voltages are needed:

(1) The set reference voltage Vref to the summing circuit 117.

(2) The previous bit's generated reference voltage Vref? to the summing circuit 117 and the analog switch 118. The voltage to the (+)input of the summing circuit 117 is connected to Vref?. The voltage to the (−)input of the summing circuit 117 is connected to Vref. The resultant voltage at V(116) from the summing circuit 117 is equal to Vref?−Vref the generated reference voltage comparator 121 compares Vin to.

If Vin<V(116) the comparator 121 does not change states, the analog switch 118 stays opened and the voltage across diode 115 is zero. The resultant output at V(116) from the summing circuit 117 is Vref?−Vref=V(116) which is also the potential at V(119).

If Vin>=V(116) the comparator 121 does change states, the analog switch 118 is closed, and diode 115 becomes reverse biased with the voltage at V(119) being greater then the voltage at V(116). The resultant output at V(119) is now equal to Vref?, while the voltage at V(116) remains equal to Vref?−Vref. The previous bit's generated reference voltage Vref? is passed on to the remaining less significant bits coupled from V(119) of this stage to the Vref? of the next less significant bit stage. Vref? of the next less significant bit is now summed with a different reference voltage and the process is repeated.

The single cell shown in FIG. 6 connects in series n times to produce a binary word of n-bits, where n is any integer number.

FIG. 7 shows the parallel reference voltage summing analog-to-digital converters from FIG. 6 connected in series to make a 4-bit binary word. Output 130 can be connected to other types of A/D converters or more of the same type of A/D converter to make larger binary words.

FIG. 8 shows the parallel reference voltage A/D converters from FIG. 6 connected in series to make a 4-bit binary word using a charged capacitor 160 to function as the summing circuit 117. A clock 150, controls the charging and A/D conversion cycles. Switches 131 are used to charge capacitors 160 during the charging half of the clock cycle. These switches, controlled by clock 150, are closed during the charging half of the clock cycle. Also during the charging half of the clock cycle, the Vin terminal is disconnected from any analog input source and connected to the 2*Vref source of the MSB to ensure all switches 118 remain open. During the A/D conversion half of the clock cycle, switches 131 are opened, the Vin terminal is disconnected from the 2*Vref source and reconnected to the analog input signal source.

Figure 9:
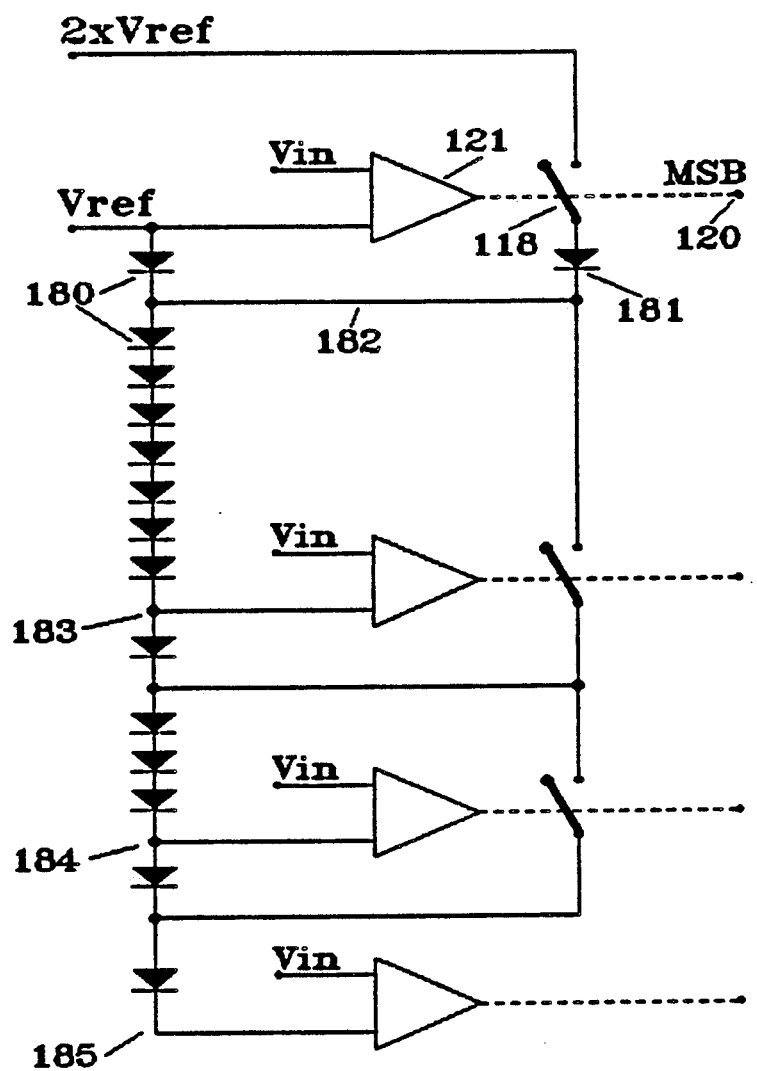
FIG. 9 shows a 4-bit parallel reference voltage summing analog-to-digital converter circuit using forward biased diodes to function as the summing circuit.

FIG. 9 shows the charged capacitors 160 of FIG. 8 replaced by semiconductor diodes like elements 180 using the forward biasing energy required by the depletion region (also called the forward dropping voltage) to subtract a constant value equal to the number of diodes 180 connected in series between successive inputs to the comparators 121. The forward dropping voltage of each diode 180 is subtracted from Vref with the difference being the reference voltage for the next less significant bit. The number of diodes 180 doubles between each comparators' input 182, 183, 184 and 185, generating the binary reference voltage. The 2*Vref source must have the value of one forward biased diode 181 subtracted to match the dropping voltage of the diode 180 between Vref and 182, which when switch 118 is closed becomes reverse bias, as diode 115 did in FIGS. 6, 7 and 8. A high input impedance is not required of the comparators 121 in FIG. 9. Diode 115, the precision diode of FIGS. 6, 7, and 8, is replaced by a semiconductor diode 180.

Except for different methods of constructing the summing circuit 117, both FIGS. 8 and 9 function as described in the description of FIG. 6.

Although I have described in detail the preferred embodiments of may invention various changes and modifications may be made within the scope of the invention concepts.

I claim:

1. A parallel summing analog-to-digital converter for the conversion of an analog input signal to a binary output, comprising:
   a first analog-to-digital converter bit comprising:
      an analog input signal;
      a means for generating a reference voltage;
      a summing circuit means for adding two potential producing a difference of the said two potentials as an output;
      said output being coupled to a resistance means;
      said summing circuit and said resistances means being in parallel with a switching means;
      said switching means being responsive to the output of a comparator means;
      said comparator means for comparing said reference voltage to the said analog input signal;
      said summing circuit subtracts said reference voltage from said analog input signal;
      said analog input signal coupled through said switching means and said summing circuit means;
      said output of said comparator means being a binary bit output;
      means of coupling said output of said comparator means to external circuitry;
      said output of said summing circuit means in parallel with said switching means generating a remainder analog output signal;
   a plurality of said first analog-to-digital converter bits being connected in series with said analog input signal coupled to said remainder analog output of previous bit to make a plurality of binary output bits.

2. The analog-to-digital converter of claim 1 wherein said summing means includes a charged capacitor with a polarity opposite of said analog input signal in series with a precision diode means and in parallel with said switching means.

3. The analog-to-digital converter of claim 1 wherein said summing means includes a charged capacitor with a polarity opposite of said analog input signal in series with a resistor and in parallel with said switching means.

4. The analog-to-digital converter of claim 2, wherein a charging means for said capacitor being said reference voltages coupled through a switching means responsive to an external input.

5. The analog-to-digital converter of claim 3, wherein a charging means for said capacitor being said reference voltages coupled through a switching means responsive to an external input.

6. The analog-to-digital converter of claim 2, wherein a charging means for said capacitor being said reference voltages coupled through a precision diode means, said reference voltage having a switching means being responsive to an external input.

7. The analog-to-digital converter of claim 3, wherein a charging means for said capacitor being said reference voltages coupled through a precision diode means, said reference voltage having a switching means being responsive to an external input.

8. The analog-to-digital converter of claim 2, wherein said precision diode means being a circuit functioning as an anode and cathode with near zero forward biasing potential.

9. The analog-to-digital converter of claim 6, wherein said precision diode means being a circuit functioning as an anode and cathode with near zero forward biasing potential.

10. A parallel reference voltage summing analog-to-digital converter for the conversion of an analog input signal to a binary output, comprising:
   a first analog-to-digital converter bit comprising:
      an analog input signal;
      a means for generating a set reference voltage;
      a previous bit's generated reference voltage coupled to a summing circuit;
      said summing circuit means for adding two potentials producing a difference of the said two potentials as an output;
      said summing circuit subtracts a said set reference voltage;
      said summing circuit output being the reference voltage for a comparator means;
      said comparator means for comparing said reference voltage to the said analog input signal;
      a precision diode means being a circuit with an anode and a cathode function with near zero forward biasing voltage drop;
      said output of said summing circuit being coupled to said anode of said precision diode means;
      said previous bit's generated reference voltage being coupled through a switching means;
      said switching means being responsive to the output of said comparator means;
      said output of said comparator being a binary bit output;
      means of coupling said binary bit output to an external circuitry;
      said previous bit's generated reference voltage coupled through said switching means being coupled to said cathode of said precision diode means;
      said coupling of said previous bit's generated reference voltage through said switching means and to said cathode of said precision diode generating a resultant reference voltage for the next less significant bit;
   a plurality of said first analog-to-digital converter bits being connected in series with said resultant reference voltage for the next less significant bit being coupled to said previous bit's generated reference voltage of the next less significant bit to make a plurality of binary output bits.

11. The analog-to-digital converter of claim 10, wherein said summing means includes a charged capacitor with a polarity opposite of said previous bit's generated reference voltage.

12. The analog-to-digital converter of claim 11, wherein a charging means for said capacitor being said set reference voltages coupled through a switching means responsive to an external input.

13. The analog-to-digital converter of claim 10, wherein said summing circuit means includes a series of semiconductor diode elements.

* * * * *